United States Patent [19]

Lange

[11] 3,955,980
[45] May 11, 1976

[54] METHOD FOR MAKING A COLOR SELECTION MASK FOR A COLOR CATHODE RAY TUBE

[75] Inventor: Howard G. Lange, Prospect Heights, Ill.

[73] Assignee: Zenith Radio Corporation, Chicago, Ill.

[22] Filed: Nov. 4, 1974

[21] Appl. No.: 520,836

[52] U.S. Cl.................................. 96/36; 156/3; 156/6; 156/11; 156/18
[51] Int. Cl.²................................. G03C 5/00
[58] Field of Search.................. 156/8, 11, 18, 3, 6; 96/36, 36.1, 38

[56] References Cited
UNITED STATES PATENTS

| | | | |
|---|---|---|---|
| 3,423,261 | 1/1969 | Frantzen | 96/36.1 |
| 3,661,581 | 5/1972 | Feldstein | 96/36.1 |
| 3,725,065 | 4/1973 | Fadner | 96/36.1 |
| 3,730,719 | 5/1973 | Law | 96/36.1 |
| 3,788,846 | 1/1974 | Mayuad et al. | 96/36.1 |

*Primary Examiner*—William A. Powell
*Assistant Examiner*—Jerome W. Massie
*Attorney, Agent, or Firm*—John H. Coult

[57] ABSTRACT

This disclosure depicts a method of forming a pattern of electron-transmissive apertures in a color selection mask for use in a color television cathode ray tube. The method comprises: providing an electrically conductive blank with a substrate layer and an aperture-defining layer; applying a coating of photoresist material on the aperture-defining layer; exposing the photoresist coating in a first preselected illumination pattern with a preselected degree of exposure and in a second preselected illumination pattern with a preselected degree of exposure substantially different from the preselected degree of exposure of the first preselected illumination pattern; developing the exposed photoresist coating corresponding to the first preselected illumination pattern; etching through the blank; developing the exposed areas of the photoresist coating corresponding to the second preselected illumination pattern thereby baring a portion of the aperture-defining layer; and etching the newly bared portion of the aperture-defining layer. Apparatus for use with the above-described method is disclosed.

7 Claims, 22 Drawing Figures

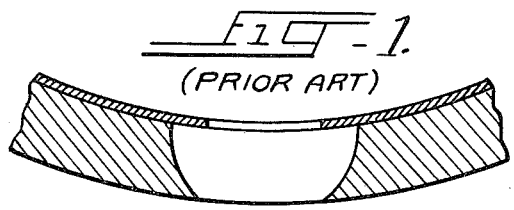
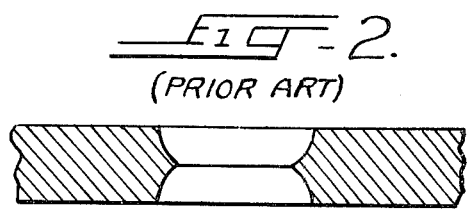
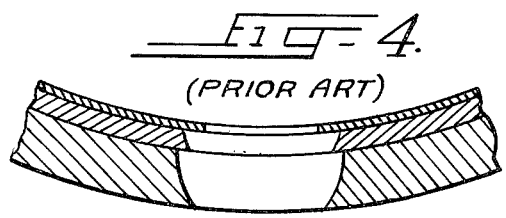
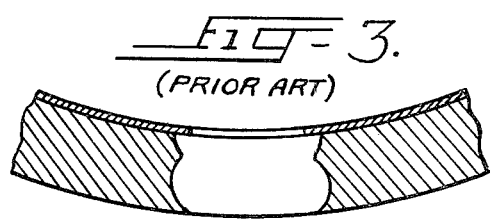
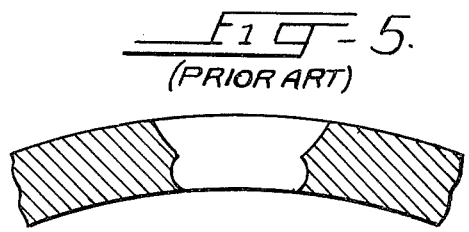
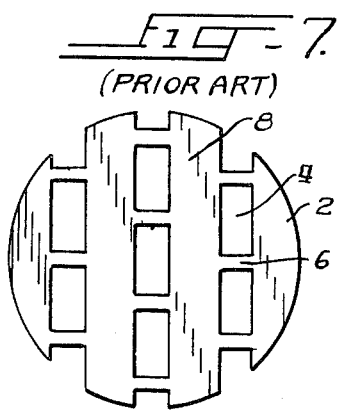
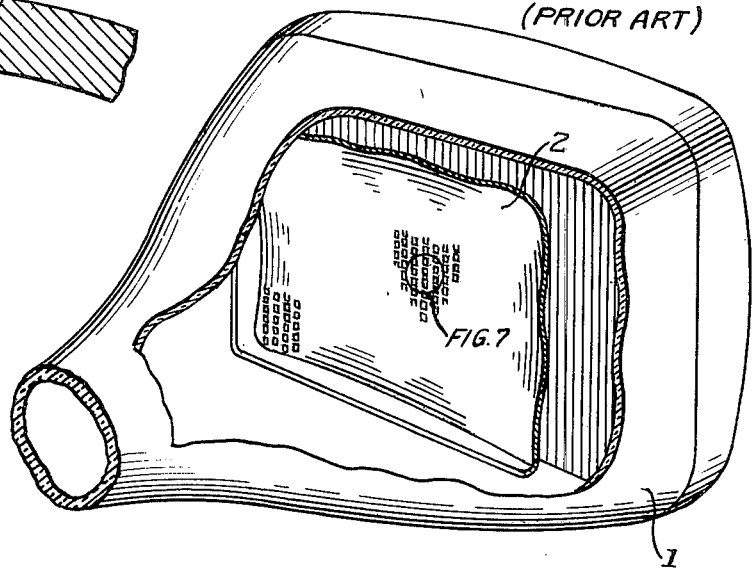
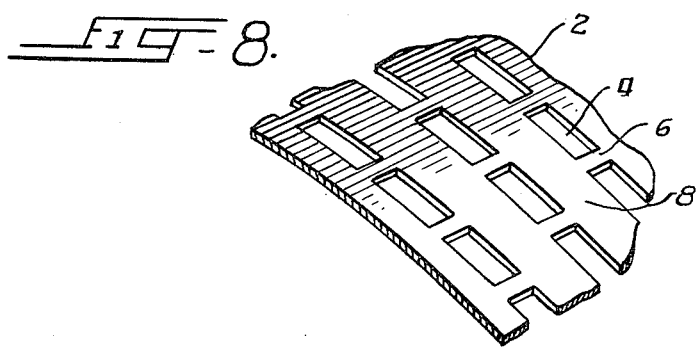

U.S. Patent   May 11, 1976   Sheet 2 of 3   3,955,980
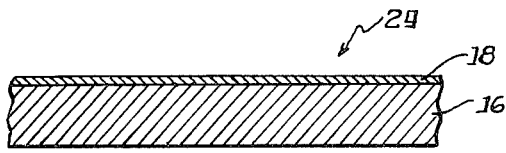
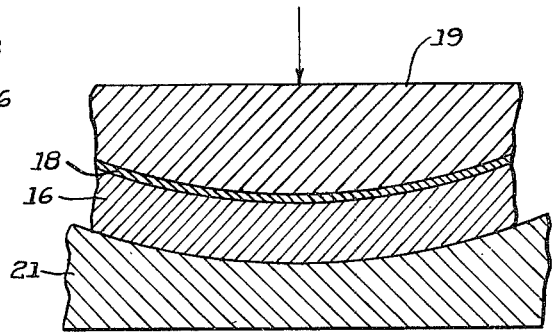
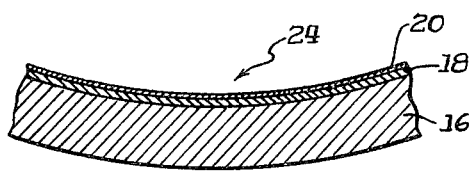
APPLY PHOTO RESIST AND DRY
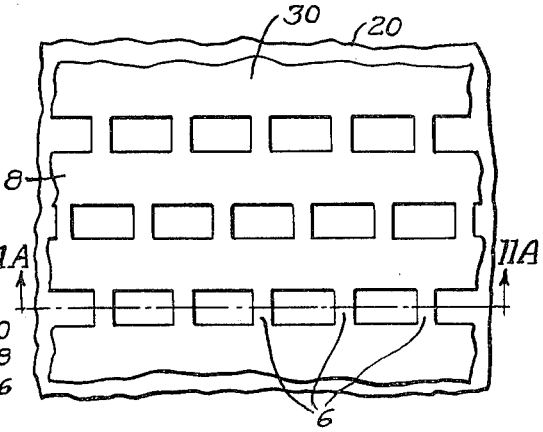
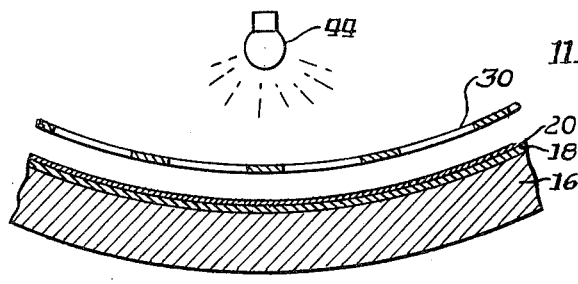
EXPOSE PHOTO RESIST
THROUGH FIRST MASTER
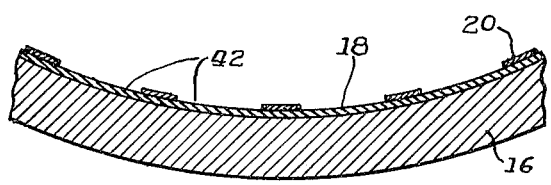
DEVELOP PHOTO RESIST
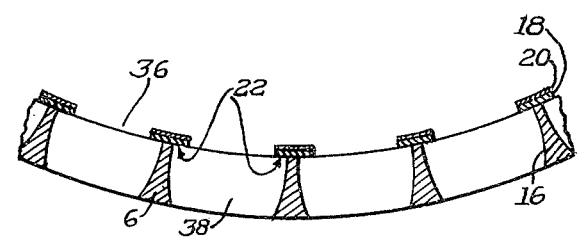
ETCH THROUGH BLANK

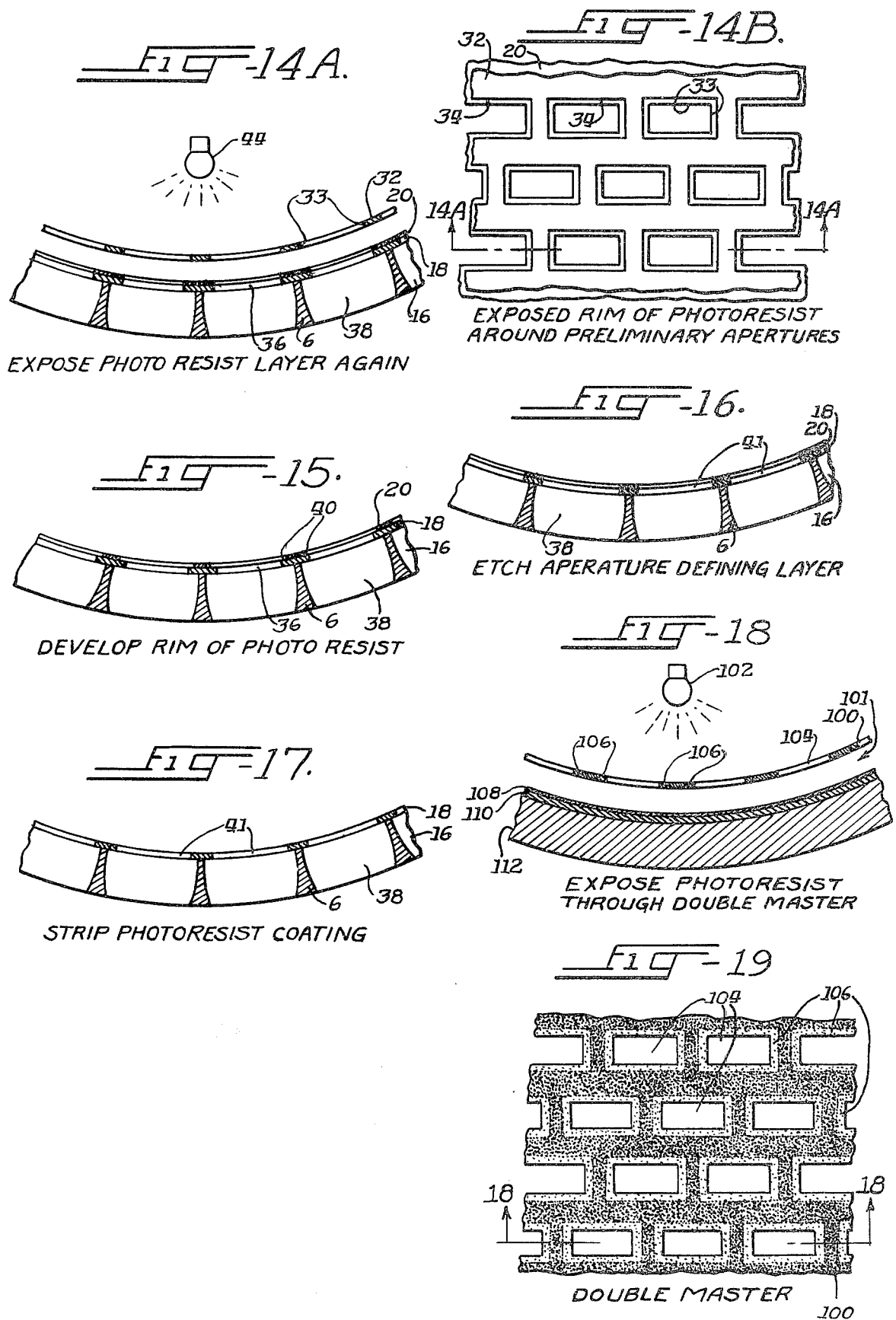

METHOD FOR MAKING A COLOR SELECTION MASK FOR A COLOR CATHODE RAY TUBE

CROSS REFERENCE TO RELATED APPLICATIONS

This application relates to, but is in no way dependent upon, copending applications Ser. No. 466,102, filed May 2, 1974 in the name of R. stachniak and Ser. No. 471,420, filed May 30, 1974 in the name of K. Palac, both having a common assignee herewith. This application further relates to, but is in no way dependent upon, copending applications Ser. No. 512,583, filed Oct. 7, 1974 and Ser. No. 538,846, filed Jan. 6, 1975, both having a common assignee herewith.

BACKGROUND OF THE INVENTION

This invention relates generally to cathode ray tubes for color television and specifically to construction of improved color selection masks therefor.

Every commercial color television cathode ray tube today includes a color selection mask which allows a selected pattern of electrons to impinge upon a corresponding pattern of light-emitting phosphor elements deposited on a cathode ray tube panel. A typical color selection mask is of the shadow mask variety, comprising a thin sheet of steel having a pattern of electron-transmissive apertures etched therein. The apertures take various forms, although typically take the form of small round holes or vertical rows of aligned slots.

Naturally, it has been desirable to etch the mask apertures as accurately as possible in order to provide each mask with accurately positioned apertures having a predetermined size and shape.

The most straight-forward method of forming the mask apertures would be to coat one side of the mask blank with an etchant-resistant coating in which there is a pattern of holes through which an etchant may be applied to the blank. The blank would then be etched by spraying an etchant onto the portion of the blank surface not protected by the etchant-resistant coating. This spray would be continued until the etchant mills a hole through the blank. Since this method of forming mask apertures would include etching from only one side of the blank, it is referred to herein as one-sided etching. FIG. 1 is a portion of a color selection mask as it would appear if etched by such a one-sided etching process.

It has been found that it is difficult to control the size of the holes which are formed in a blank with one-sided etching. For example, variations in the thickness of a blank, which is normally made of 6 mil steel, etching non-uniformities and hole cleanliness tend to introduce undesirable variations in the size and shape of the mask apertures. A particularly undesirable characteristic of one-sided etching is that, while the etchant is creating an opening in the steel in the direction of the thickness of the blank, it is also laterally etching away or "undercutting" the metal of the blank beneath the etchant-resistant coating which lies on the surface of the blank. This undercutting continues as long as the etchant is applied to the blank and is definitely undesirable from the standpoint of mask strength. The thicker the blank, the longer the etchant must be applied to completely etch through the blank, thus a greater amount of undercutting is caused to occur during the process. Typically, an etchant will undercut or etch laterally about 0.5 mils for every 1 mil of through etching. Thus, for a 6 mil thick blank, undercutting may eat away up to 3 mils or more of the blank around each aperture.

In order to avoid the undesirably large amount of undercutting which is associated with one-sided etching, methods of etching masks from two sides have been developed and are used commercially throughout the world. Conventional methods of manufacturing color selection masks start with a flat blank sheet of metal nominally 6 mils thick. Normally the first step in the etching process is to coat at least one surface of the blank with a photoresistant material. In the two-sided manufacturing process both sides of the blank are coated with the photoresistant material.

Photoresist materials are of either the positive-working or negative-working type and are referred to as either positive or negative photoresists. A positive photoresist, on exposure to actinic light, undergoes changes which render it soluble in a developing solution which may be used to wash away the exposed photoresist. A negative photoresist, on exposure to actinic light, undergoes polymerization and becomes insoluble in an associated developing solution.

Although either type of photoresist may be used, for purposes of simplicity and clarity of description, the following background discussion deals exclusively with the use of a positive photoresist.

In the two-sided etching process, corresponding mask masters having predetermined related patterns of light-transmissive areas and the photoresist-coated blank are placed on a conventional lighthouse where an illumination pattern of electron-transmissive apertures is formed on each blank surface by exposing the photoresist coatings to actinic light transmitted through each respective mask master. The exposed areas, corresponding to the pattern of apertures, are solubilized and are washed away in a developing solution, baring the metal electrode surfaces.

An etchant is sprayed from a battery of etchant nozzles onto the opposed blank surfaces, etching those areas of the blank bared by the exposure and development processes. The etchant mills through the blank from both sides to form the desired electron-transmissive apertures in the blank, as shown in FIG. 2.

In addition to the through etching of the blank, it has been found that lateral etching or undercutting of the photoresist layer also occurs at a rate of approximately one-half the rate of the through etching; thus in a typical blank 6 mils thick the lateral etching would normally be approximately 3 mils, or 1½ mil around the aperture periphery. However, since in the two-sided process the etchant etches through the blank from each side, the lateral etching is correspondingly reduced. Yet, because of this lateral etching, even though substantially reduced by the two-sided process, it is extremely difficult to control the shape of the aperture periphery. It has been found, in the manufacture of slot-type masks, to be very difficult to form tie bars which are acceptably narrow without unduly weakening the mask.

As said before, customarily aperture etching is performed on a flat sheet of electrically conductive metal. After the desired apertures have been etched, the etched mask is spherically or biradially formed to approximately the same contour as the cathode ray tube faceplate to which it is to be mated. During the forming process varying degrees of stress are put on the blank, causing many of the apertures, especially those on the mask edges, to be deformed. The forming process consists primarily of a stamping or drawing operation which by its nature causes different stresses to be put on individual masks and mask sections. Similarly, the positioning devices for holding the mask on the forming device do not position each individual mask in the same location, thus each resulting formed mask is different from all others, causing non-uniformity in the array of apertures from mask to mask.

These stresses and the non-uniformity of the aperture array from mask to mask virtually rule out the possibility of making color selection masks that are interchangeable each with all others in the assembly of a cathode ray tube of a given size and shape. The present state of the art compensates for the deformation variations from mask to mask by uniquely mating a given mask to a given cathode ray tube faceplate. Each mask is used as the stencil or master during the photoprinting of the phosphor screen on the cathode ray tube faceplate. Thus, any irregularities in the mask are duplicated in the screen patterns formed on the faceplate. Clearly, since each mask has different aperture deformations and a non-uniform array of apertures, random interchangeability of masks and faceplates is not possible with conventional tube manufacturing methods.

It is desirable in the interest of standardizing mask aperture patterns, to preform the mask blank prior to the etching process. Etching a preformed blank would virtually eliminate aperture deformation caused by the forming process. Substantial aperture pattern uniformity from mask to mask would enable the faceplate phosphor pattern to be made with a single mask master.

The primary disadvantage of the two-sided etching approach described above is the strict requirement of hole pattern alignment needed on opposite sides of the blank to precisely form properly sized and shaped apertures. This disadvantage has the practical effect of possibly limiting the applicability of the two-sided process to flat blanks. Thus, to manufacture masks from preformed blanks enabling random interchangeability of masks and cathode ray tube faceplates, it appears that some type of one-sided etching process, avoiding the requirement of registering masters on opposite sides of a pre-contoured blank, is the practical solution.

One approach to one-sided etching of the photoresist, described and claimed in U.S. Pat. No. 3,794,873, and having a common assignee herewith, utilizes a laminated color selection mask as shown in FIG. 3 wherein typical laminants comprise a thin nickel aperture-defining layer bonded to a relatively thick substrate layer of steel. Two etchants are used — one to etch through the aperture-defining layer, hereafter referred to as an aperture layer etchant, and the other to etch through the steel substrate layer, hereafter referred to as a substrate etchant. It has been found that the severe undercutting of the aperture-defining layer which results from one-sided etching is somewhat reduced by this method. The substrate reacts quickly to the substrate etchant and slowly to the aperture layer etchant and the aperture-defining layer reacts similarly to the respective aperture etchant and substrate etchant. The respective reaction times reduce the overall etching time for etching through the blank, thereby reducing the time the etchant is in contact with the respective layers and resulting in reduced undercutting in the substrate. However, a serious problem still exists in the manufacture of slot-type masks where narrow tie bars (e.g., 4 mils or less) must be formed.

The severe undercutting associated with one-sided etching has led to alternative methods of one-sided etching for color selection masks. In one method, described and claimed in the referent application Ser. No. 466,102, to avoid this severe undercutting and the registration problems associated with the two-sided etching process, a laminated color selection mask blank is coated on one side with an etchant-resistant coating. A typical laminate mask blank may comprise a ½ mil aperture-defining layer of nickel, a 1½ mil core layer of copper alloy, and a 4 mil steel substrate, as shown in FIG. 4. After the etchant-resistant coating is applied, an aperture array is made by exposing the photoresist coating, through a master, to actinic light in developing the exposed areas. An etchant, which may be ferric chloride, is then applied to the blank. The first etchant chemically etches the aperture-defining layer and the core layer. After a wash process, a second etchant, typically ferric sulfate, is applied to the partially etched mask blank. The nickel aperture-defining layer and the copper core layer, being impervious to ferric sulfate, resist etching while the steel substrate is being etched. Reduced undercutting results. This process of etching has formerly been labeled a laminated coring one-sided etching process.

Another method of performing one-sided etching without producing severe undercutting, described and claimed in the referent application Ser. No. 471,420, uses a laminate mask blank which may be composed of a ½ mil nickel aperture-defining layer bonded to a 6 mil substrate of steel. See FIG. 3 for basic construction of a blank used in this method. The color selection mask blank is first coated with a photoresist and etched with an etchant, typically ferric chloride. After the first etching process the blank, including the cavities etched by the first etchant, is again coated with a photoresist material (preferably of the positive-working type) and the cavity bottoms only are subsequently exposed to ultraviolet light. Upon development of the photoresist, the unexposed photoresist is retained on the surface of the mask blank and the undercut portions of the cavity, leaving exposed only that portion of the cavity exposed (on the second exposure) to the ultraviolet irradiation. Upon application of a second etchant such as ferric sulfate, the substrate is etched through. The resulting mask aperture profile is not shown, but is similar to that shown in FIG. 4. The same method may be used on a single layered blank, as shown in FIG. 5, a method where the etching is from the convex side of the preformed blank.

Each of the prior art methods of one-sided etching represent improvements in the basic one-sided aperture etching process, but have been found not to be completely satisfactory in every respect. The myriad of problems associated with one-sided etching, the most severe being the undercutting problem, has before this invention made one-sided etching a difficult approach to etching acceptable apertures of the slot type in a preformed mask blank. In a slot-type mask, the vertically running slats separating the openings or slots in the mask through which the electrons pass on their way to the cathode ray tube screen are held together by horizontally running tie bars which, for the sake of maximized brightness and minimum moire' pattern generation, should be as narrow as possible. The one-sided etching processes known to date are not completely acceptable because of the weakened condition of the mask which results from the undercutting or etching away of the tie bar areas. To compensate for the described undercutting, and to impart sufficient strength to the mask, the tie bars have had to be made undesirably wide. This invention provides a method of etching preformed blanks maintaining narrow, structurally strong tie bars having reduced undercutting of the aperture-defining layer.

The above discussion has dealt primarily with the problems associated with etching or shadow masks from one side and certain prior art attempts to cope with such problems, particularly in the context of shadow masks which are preformed (precontoured) before being etched (from one side). This invention has broader applicability, however.

In tubes of the negative guardband, black surround type, as explained, the electron beam landing spots are larger than the impinged phosphor elements. Since in conventional practice the shadow mask is used as the exposure stencil during the photoexposure operations used to screen the faceplate, some method must be provided for causing the electron beam spots to be larger than the impinged phosphor elements. Two methods are employed commercially. The first is the so-called "re-etch" or "etch-back" method wherein the shadow mask apertures are originally formed to the (smaller) size of the phosphor elements, and then after the screening operations, the shadow mask is "re-etched" (etched a second time) until the shadow mask apertures are larger than the phosphor elements by an allotted tolerance value, thus producing the desired negative guardband.

The second method used commercially to cause the mask apertures to be larger than the associated phosphor elements is to use a shadow mask which has full-sized apertures and, by the use, e.g., of special photoreduction techniques during the screening operation, to cause the phosphor elements to be smaller than the shadow mask apertures.

By the application of this invention, there may be provided yet another commercially practicable method for making shadow mask-faceplate assemblies in which the mask apertures are ultimately larger than the associated phosphor elements.

OBJECTS OF THE INVENTION

It is a primary object of this invention to provide a master for use in the manufacture of color cathode ray tube color selection masks.

It is another object of this invention to provide an improved method of etching electron-transmissive apertures in a color cathode ray tube color selection mask.

It is still another object of this invention to provide a method for etching apertures in a color cathode ray tube mask from one side, which method offers greatly improved control of the size, shape and distribution of the apertures, and greatly reduced undesirable aperture undercutting.

It is yet another object of this invention to provide an improved process for etching slots in a slot-type cathode ray tube color selection mask, which method results in a reduced amount of undesirable undercutting of the tie bars, thus yielding narrow but strong tie bars.

It is still another object of the invention to provide an improved method of etching such slot apertures which results in precision etching of the tie bars.

It is still another object to provide a method by which apertures in a color selection mask for a color cathode ray tube can be formed with precision.

It is also an object of this invention to provide an improved method of etching apertures in a color cathode ray tube selection mask which is intended to be interchangeable between cathode ray tubes of a given size and shape.

It is yet another object to provide an improved method for making a color cathode ray tube of the negative guardband, black surround type, and particularly an improved method for making a shadow mask having relatively small apertures useful for screening a phosphor pattern on a cathode ray tube faceplate and for enlarging the apertures, after screening, to the desired ultimate size.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIGS. 1–5 are cross-sectional views of apertures etched in mask blanks by prior art processes;

FIG. 6 is a diagrammatic view of a cathode ray tube utilizing a typical slot-type shadow mask;

FIG. 7 is an enlarged view of a portion of the slot-type shadow mask in FIG. 6;

FIG. 8 is a portion of the slot-type shadow mask shown in FIG. 6, showing the three-dimensional curvature characteristics of the mask;

FIGS. 9A–17 collectively show a process disclosed and claimed in the referent copending application Ser. No. (2105);

FIG. 18 is a view illustrating novel steps of the present method; and

FIG. 19 shows a top view of an exposure master used in the process of this invention.

DESCRIPTION OF THE PREFERRED EMBODIMENTS

FIG. 6 schematically depicts a portion of a color television cathode ray tube 1 having a color selection mask 2 of a type generally referred to as a slot mask. Portions of FIG. 6 have been shown with exaggerated dimensions to more clearly show the interrelationship between the color selection mask, the slots 4 on that mask and the other portions of the cathode ray tube.

FIG. 7 is an enlarged view of the portion of the slot mask 2 shown in FIG. 6. The mask 2 comprises a sheet of electrically conductive material such as steel having formed therein apertures or slots 4, separated vertically by narrow sections of the mask, commonly referred to as tie bars 6, and vertically running slats 8 between the vertical rows of slots 4. The mask 2 generally takes a spherical, bi-radial or other three-dimensional contour much like that portion of the color selection mask displayed in FIG. 8. As previously mentioned, the most common problem in the formation of apertures in the slot-type mask manufacturing process is the maintenance of structurally strong but narrow tie bars between the slots. Again, the tie bars 6 should be narrow enough to suppress moiré'-type patterns on the cathode ray tube screen and reduce electron beam absorpiton, but strong enough to give structural support to the mask. Most conventional etching processes inadequately control the size, shape and profile of the slots, and consequently the resulting tie bars between the slots.

Before engaging a full discussion of the present invention, and in order to promote a more complete understanding thereof, a related method described and claimed in the referent copending application Ser. No. 512,583, filed Oct. 7, 1974 will be described.

FIGS. 9A through 17 represent schematically the steps of the method of forming apertures in a color selection mask blank according to the teachings of the said copending application. This metthod commences with the provision of an etchable, electrically conductive flat blank 24 of metal. See FIG. 9A. In accordance with the invention, this embodiment utilizes an electrically conductive laminated flat blank 24 comprising a substrate 16 and an aperture-defining layer 18. The substrate 16 may comprise an approximately 6 mil thick layer of steel and the aperture-defining layer 18, hereinafter called the aperture layer, may comprise a nominal ½ mil thick layer of nickel. The two layers are either bonded together, or the nickel is plated on the steel substrate layer, to form the electrically conductive blank 24.

The electrode blank is preferably preformed into a generally three-dimensional, spherical shaped blank having the general curvature characteristics of a cathode ray tube face-plate. The blank may be preformed by any of the well-known acceptable methods used in the industry.

After preforming electrode blank 24 into a three-dimensionally curved shape, a first patterned, etchant-resistant structure is established on the concave aperture layer, forming a pattern of openings on the aperture layer. This pattern corresponds to the pattern of electron-transmissive apertures subsequently to be formed in the aperture layer, but at least a predetermined group of the openings are of a smaller size than the ultimate mask aperture size. The preferred approach to establishing this etchant-resistant structure is to coat the mask blank, preferably the aperture layer, with at least one layer of photoresist material, as previously described, then use well-known photographic exposure and developing methods to form the preselected pattern of openings in the aperture layer.

A coating 20 of photoresist, nominally 1–2 microns thick, is applied, FIG. 10, to the surface of the aperture layer 18. As explained in the Background of the Invention, there are two types of photoresist material that may be used in the etching process. This particular embodiment uses a positive photoresist material, for example Shipley's AZ 1350, on the aperture layer 18 as shown in FIG. 10. As previously set forth actinic light exposes positive photoresist material in such a manner that the exposed areas become depolymerized and are thus soluble in an appropriate developer solution. The positive photoresist coating 20 on the aperture-defining layer 18, if of the type noted, is preferably exposed for approximately 15 seconds through a positive first mask master 30 as shown in FIG. 11A.

FIG. 11B shows a top view of the photoresist layer 20 as viewed through the first master 30. Those areas of the photoresist coating 20 seen through the master are the photoresist areas to be exposed by actinic light from source 44. The first master 30 has a first preselected pattern of appertures which correspond in distribution to the general pattern of electron-transmissive apertures to be formed on the electrode blank 24. At least a predetermined group, if not all, of these pattern elements are of a smaller size than the desired size of the ultimate apertures to be eventually formed in aperture layer 18. The reason for this will become clear as this description proceeds.

A caustic base developing solution which may be the same as that used in the preferred embodiment of referent application Ser. No. (2105), is used to develop those photoresist areas exposed to light source 44, forming patterns of openings 42 in positive photoresist layer 20, as shown in FIG. 12, that correspond to the illumination pattern formed by master 30 and light source 44.

After the pattern of openings 42 formed in the coating 20 by the developer solution, the blank's concave surface is sprayed with an etchant solution, which may be the same as those etchants used in other processes described herein, chemically attaching those bared areas of the nickel aperture layer, forming in the blank a preliminary pattern of sharply rectangularly shaped apertures 36.

Generally about a 1½ minute spray of etchant will etch through the nominal ½ mil layer of nickel and approximately 2 to 3 mils of the 6 mil substrate 16. As the etchant etches through the substrate 16, undercutting 22 of the aperture layer 18 occurs at the rate of about 2:1, i.e., for every mil of through etching, approximately .5 mil of lateral etching or undercutting occurs.

After the ferric chloride etchant application, a second etchant, preferably ferric sulfate, 35%–40% by weight, may be sprayed from the battery of spraying heads onto the partially etched apertures to finish etching through the substrate 16 of steel. The nickel aperture-defining layer 18 used in this particular embodiment is virtually insoluble in the ferric sulfate etchant, thus virtually no etching of the aperture-defining layer occurs during the ferric sulfate etchant application, most of the etching being through the remaining 3 to 4 mils of the steel substrate 16. The apertures 38 formed in the steel substrate have the ultimate desired size. After the preliminary apertures 36 are formed in the aperture layer 18 and the ultimate apertures 38 are formed in the substrate 16, the electrode blank is washed and dried and prepared for a second exposure.

After forming the preliminary shaped apertures 36 it is desirable to establish a second etchant-resistant structure on the aperture layer 18. The second structure preferably has formed therein a second preselected pattern of openings which substantially correspond in distribution to the pattern in the first structure, but at least a predetermined group of the openings being greater in size than their corresponding counterparts in the first structure.

The positive photoresist coating 20 is utilized along with a second master 32 to establish the second etchant-resistant structure. The second master 32, which has substantially the same distribution of openings as the first master 30, FIGS. 14B and 11B respectively, but which has at least a predetermined group of its openings 33 larger in size than their respective counterparts in master 30, may be placed with the once-etched blank 24 on a lighthouse, which may be the same lighthouse on which the first exposure of the coating 20 was made. See FIG. 14A. Each rim 34 of the photoresist coating 20, around the preliminary etched openings 36, FIG. 14B, is exposed by light source 44 which is actinic to the photoresist coating, forming a second illumination pattern on the photoresist coating 20, in which the pattern elements substantially correspond in distribution to their respective counterparts in the illumination pattern formed by the first exposure operation. The ultimate sized and shaped apertures to be formed in aperture layer 18 are each defined by the area of the preliminary aperture 36 and the area comprising the rim 34. At least a predetermined group of the second illumination pattern elements in the aperture layer 18 have a respectively larger element size than their respective counterparts formed in the aperture-defining layer by the first master.

The rim 34 of exposed photoresist shown in FIG. 14B is developed by a caustic base developer which may be the same as that developer employed in the first developing process. The developing solution bares a rim 40 of the nickel aperture layer as shown in FIG. 15. This rim 40 in aperture layer 18 corresponds directly to the rim 34 of photoresist 20 shown in FIGS. 14A and 14B. The bared rim 40 in the aperture layer is etched, for example, with a ferric chloride etchant, which may have the same concentration as the ferric chloride etchant used in the first etchant operation. It is preferable to spray the etchant solution onto the blank 24 at substantially 15–25 psi for approximately 10 seconds, etching the aperture layer 18, forming therein the desired ultimately shaped, sharply rectangular apertures 41. See FIG. 16. These electron-transmissive apertures 41 in the aperture-defining layer have the desired ultimate size and shape, and have substantially the same distribution pattern as the preliminary sized and shaped apertures 36 etched in the first etching operation.

After the second etching process, the etched blank 24 is stripped of the remaining photoresist 20 (FIG. 17). The blank is then washed and dried. After drying the etched blank, the resulting electron-transmissive color selection slot mask having precisely formed, sharply rectangular apertures 41 in the aperture layer 18 is prepared for mounting in a cathode ray tube faceplate.

Having described the invention of the copending application Ser. No. (2105), against this backdrop, the present invention will be described.

One method of forming apertures in a color selection mask blank in accordance with the teachings of this invention is a single exposure method utilizing an etchant application to be described in further detail below. The preferred embodiment utilizes an electrically conductive laminated blank 101, FIG. 18, comprising preferably a nominal ½ mil nickel aperture-defining layer 110 hereinafter referred to as the aperture layer, and approximately 6 mils of steel as a substrate 112, preformed into a generally spherical, bi-radial or multi-contoured shaped blank having the general curvature characteristics of a cathode ray tube faceplate.

It is desirable to preform the laminated blank 101 to a generally three-dimensional shape as shown by the forming process in FIG. 9B. The blank may be formed by a stamping process wherein the aperture layer is on the concave side of the blank after the forming process and the substrate is on the convex side of the blank after the forming process. Any type of stamping or drawing process may be used which will adequately preform the blank into a generally spherical, bi-radial, or other desired contour. As conceptually shown in FIG. 9B, a movable force F is applied to the aperture layer side of the blank, forcing the blank as a whole to take the form of both the force applying member 19 and a stationary member 21.

After preforming electrode blank 101 into a three-dimensionally curved shape, a first patterned, etchant-resistant structure is established on the concave aperture layer, forming a pattern of openings on the aperture layer. This pattern corresponds to the pattern of electron-transmissive apertures subsequently to be formed in the aperture layer, but at least a predetermined group of the openings are of a smaller size than the ultimate mask aperture size.

The preferred approach to establishing this etchant-resistant structure is to coat the mask blank, preferably the aperture layer, with at least one layer 1–2 microns thick of a positive photoresist material 108. For example, Shipley's AZ 1350 may be used to coat the aperture layer.

As explained in the Background of the Invention, there are two types of photoresist material that may be used in the etching process. The preferred embodiment uses a positive photoresist material 108 on the aperture layer 110 which, when exposed to a light source 102 actinic to the photoresist, exposes the photoresist material, the exposed areas becoming depolymerized and thus soluble in an appropriate developer solution. The positive photoresist coating 108 on the aperture-defining layer 110, if of the type noted, is preferably exposed for approximately 15 seconds through a novel, specially constructed master 100 as shown in FIG. 19.

The master 100 used in preferred embodiment has two patterns of openings through which light may be transmitted. See FIG. 19. Each of these patterns, when placed with the photoresist coated blank on a lighthouse and exposed by light source 102, forms a distinct pattern on the photoresist coating. The pattern of openings in the master 100 are superimposed over each other. It is preferable that the first pattern of openings, a preliminary pattern, be transparent and of a predetermined size and shape. They may be sharply rectangular in shape but they are not limited to such a shape. The second pattern of openings is superimposed over the first pattern and at least a predetermined group of the openings are larger than their respective counterparts in the first pattern. When superimposed, the two patterns of openings look like the master displayed in FIG. 19. The clear areas 104 correspond to the openings in the first pattern and the shaded 106 and clear 104 areas collectively correspond to the openings in the second pattern.

A first pattern of elements on the photoresist is created when light source 102 shines through the master's clear areas 104 onto the photoresist coating. Contemporaneously, a second pattern of elements is created on the photoresist coating when light source 102 shines through the shaded 106 and clear 104 areas, collectively.

The optical density of the shaded area being substantially different than that of the clear areas makes the degree of exposure of the two patterns on the photoresist decidedly different, FIG. 19, the areas corresponding to the shaded areas 106 in master 100 being less exposed than those areas corresponding to the master's clear areas 104.

In the preferred embodiment of the invention, the master 100 has a glass substrate, which may be substantially the shape of the mask blank to be exposed. The substrate carries a pattern of openings of varying optical density preferably corresponding to the pattern of apertures to be formed in the color selection mask.

The mask in the claimed invention has a first predetermined pattern of openings 104, each and every opening preferably having a first predetermined distribution, size, shape and optical density. In the preferred embodiment, the optical density of the openings 104 is zero, the shape is substantially rectangular and the size is preferably the size of the ultimate aperture to be formed in the substrate of the electrode blank. In the preferred embodiment the second predetermined pattern of openings 106 is substantially superimposed over said first pattern with each respective opening substantially superimposed over the respective openings which form the first pattern on the master. Each and every opening in the second pattern also has a predetermined size, shape and optical density, the optical density being zero where the openings in the first and second patterns are coincident or overlap each other and greater than zero where they are not coincident or overlapping each other, the shape being sharply rectangular and the size being substantially greater than the size of the openings in the first pattern. In FIG. 19 the clear areas 104 represent the areas of zero optical density, the shaded areas 106 represent an optical density greater than zero, and the black areas represent maximum optical density.

The degree of exposure of the photosensitive coating on the mask blank is dependent on the amount of light projected through the two respective patterns of openings. The amount of light projected through the zero optical density portion of the mask 104 is much greater than the amount of light projected through the area 106 where the optical density is greater than zero. Clearly, the exposure of those photosensitive areas directly related to the areas of the mask where the optical density is maximum is virtually zero. In essence, the mask utilized in the preferred embodiment establishes three areas on the photosensitive coating, each having a different degree of exposure.

A developer solution, which is preferably a caustic base solution, having a predetermined concentration is applied to the blank for a first predetermined amount of time, washing away the photoresist exposed through the clear areas of the mask.

After the pattern of openings is formed in the coating 108 by the developer solution, the blank 101 is sprayed with an etchant solution such as ferric chloride, having a concentration of 42 Baume', from a battery of etchant spraying heads. Preferably, the etchant is sprayed onto the concave side of the blank at approximately 25 psi for approximately 1½ minutes. The etchant chemically attacks those bared areas of the aperture layer, forming in the aperture layer 110 preliminary sized and shaped apertures and in the substrate ultimate sized and shaped apertures.

In the preferred embodiment a 1½ minute spray of etchant will etch through the nominal ½ mil layer of nickel and approximately 2 to 3 mils of the 6 mil substrate. As the etchant etches through the substrate, undercutting of the aperture layer occurs at the rate of about 2:1, i.e., for every mil of through etching, approximately .5 mil of lateral etching or undercutting occurs.

After the ferric chloride etchant application, a second etchant, preferably ferric sulfate, 35%–40% by weight, may be sprayed from the spraying heads onto the partially etched apertures to finish etching through the substrate 16 of steel. The nickel aperture-defining layer 110 used in the preferred embodiment is virtually insoluble in the ferric sulfate etchant, thus virtually no etching of the aperture-defining layer occurs during the ferric sulfate etchant application, most of the etching being through the remaining 3 to 4 mils of the steel substrate.

A developer solution which may be the same as that developer used to develop the photoresist the first time, but having a second predetermined concentration, is applied to the blank surface for a second predetermined amount of time, washing away that photoresist exposed through the shaded area 106 of master 100 contemporaneously baring a rim of the aperture layer and cleaning the previously etched apertures of any photoresist residue which tends to accumulate in the apertures during the etching process.

Again an etchant, preferably ferric chloride, is sprayed onto the blank surface, etching the bared rim of the aperture layer that surrounds each preliminary aperture, forming in the aperture layer ultimate sized, sharply rectangular shaped apertures.

A caustic base solution may then be used to remove any remaining photoresist in final preparation of readying the completed mask for mounting in a cathode ray tube panel. As is well-known in the photographic art, a less exposed photographic material developed for a longer period of time can be comparable to a more exposed photographic material developed for a shorter period of time. Thus the respective degrees of exposure, the differing times for developing the two differently exposed areas of the photoresist, and the differing concentrations of the developer establish a two step etching method wherein only one lighthouse exposure of the photoresist coating is required.

Virtually all detectable undercutting occurs during the first process of ferric chloride and ferric sulfate etching, with very little, if any, undercutting occurring during the second ferric chloride etching operation, thus the substrate is left substantially the same as it was prior to the second application of the ferric chloride. This is largely due to two things: (1) the short time (approximately 10 seconds) the etchant is allowed to remain on the blank and (2) the relative thinness (nominally ½ mil) of the aperture layer 18.

These ultimate shaped apertures in the aperture layer sharply define the tie bars in the aperture layer. The tie bars in the substrate are defined by the first etching operation, during which most of the etching in the substrate is caused to occur. The slot-mask manufacturing process is started by etching a preliminary aperture, smaller than desired, through the blank. The lateral etching or undercutting is designed according to a predetermined specification to yield a desired size tie bar in the substrate. The second etching operation is performed on a precisely specified area of the aperture layer which preferably corresponds to the pattern of preliminary apertures forming apertures in the aperture layer with specifically designed tie bars between them.

The predetermined design of the tie bars is dictated by both the preference of having narrow tie bars to reduce moire' patterns and increase mask transmission and by the desirability that the mask be structurally strong as well. As discussed in the Background of the Invention, undercutting of the aperture layer is the most significant problem in maintaining narrow, yet strong, tie bars.

The process has designed within its steps controlled etching and undercutting, causing narrow, yet strong tie bars to be formed between apertures.

A different approach still encompassed by the principles of the invention, is the utilization of two separate masters instead of the one composite master 100 (see FIG. 19) used in the method just described. This method utilizes two separate masters, one master having a first predetermined pattern of clear openings, the second master having a second predetermined pattern of clear openings, the remainder of the mask having a predetermined optical density but not being opaque. The distribution of openings in the two masks is substantially the same, but at least a predetermined number of the openings in the second master may be smaller than their respective counterparts in the first master. Superimpose the two masks and expose a photoresist covered blank to a light source actinic to the photoresist. Alternatively, the two masks could be introduced in sequence and a double exposure of the photoresist layer 108 made. The exposure pattern on the photoresist may be substantially the same as that pattern in the most recently disclosed process (see FIG. 18). The etching steps may be similarly performed to etch first preliminary apertures in the aperture layer and ultimate apertures in the substrate and then the ultimate apertures in the aperture layer.

Still other changes may be made in the above-described methods without departing from the true spirit and scope of the invention herein involved and it is intended that the subject matter in the above depiction shall be interpreted as illustrative and not in a limiting sense.

What is claimed is:

1. For use in the manufacture of color selection masks for color television cathode ray tubes, a method of forming a pattern of electron-transmissive apertures of a predetermined size, shape and distribution in a color selection mask, said method comprising:
   providing an etchable, electrically conductive blank having a substrate layer on which is disposed an aperture-defining layer;
   applying a coating of photoresist material on said aperture-defining layer of said blank;
   exposing the photoresist coating contemporaneously, in a first preselected illumination pattern with a preselected degree of exposure and with pattern elements corresponding in distribution to the pattern of apertures to be formed, at least a predetermined group of said elements being smaller in size than the desired ultimate mask aperture size, and
   in a second preselected illumination pattern with a preselected degree of exposure substantially different from said preselected degree of exposure of said first preselected illumination pattern and with pattern elements substantially corresponding in distribution to said first preselected illumination pattern, but being substantially the size and shape of the desired ultimate mask aperture size and shape;
   developing the exposed photoresist corresponding to the first preselected illumination pattern;
   etching through the blank to form in said aperture-defining layer a preliminary pattern of apertures having, at least in a group of apertures corresponding to said group of pattern elements, a predetermined size which is smaller than the desired ultimate mask aperture size and to form in the substrate layer a pattern of apertures having the desired ultimate size and shape, each respectively undercutting the corresponding preliminary apertures in said aperture-defining layer;
   developing the exposed areas of the photoresist coating corresponding to said second pattern of elements, thereby baring a portion of said aperture-defining layer substantially surrounding at least a portion of each of said preliminary etched apertures in said aperture-defining layer; and
   etching through the newly portions of said aperture-defining layer to form a pattern of electron-transmissive apertures in the aperture-defining layer of the blank having the desired ultimate mask aperture size and shape.

2. A method in accordance with claim 1 wherein said photoresist coating is composed of a positive-working photoresist.

3. A method in accordance with claim 1 wherein said aperture-defining layer is thinner than said substrate layer.

4. A method in accordance with claim 2 wherein said color selection mask is preformed into a three-dimensionally curved configuration prior to application of the photoresist coating.

5. A method in accordance with claim 4 wherein said preformed mask is formed from a flat blank to assume a generally spherical or multi-radial contour.

6. A method in accordance with claim 5 wherein said aperture-defining layer is on the concave side of the mask, has a thickness of about ½ mil, and is composed of nickel, and wherein said substrate has a thickness of about 6 mils and is composed of steel.

7. A method in accordance with claim 6 wherein said forming of said apertures is accomplished by etching from the concave side of said three-dimensionally preformed color selection mask.

\* \* \* \* \*